United States Patent
Wu et al.

(10) Patent No.: US 12,255,175 B1
(45) Date of Patent: Mar. 18, 2025

(54) WAFER WARPAGE REGULATION EPOXY FUNCTIONAL FILM, AND PREPARATION METHOD AND APPLICATION THEREOF

(71) Applicant: Wuhan Sanxuan Technology Co., Ltd, Wuhan (CN)

(72) Inventors: De Wu, Wuhan (CN); Qiao Zhou, Wuhan (CN); Shuhang Liao, Wuhan (CN); Junxing Su, Wuhan (CN)

(73) Assignee: Wuhan Sanxuan Technology Co., Ltd, Wuhan (CN)

( * ) Notice: Subject to any disclaimer, the term of this patent is extended or adjusted under 35 U.S.C. 154(b) by 0 days.

(21) Appl. No.: 18/811,589

(22) Filed: Aug. 21, 2024

Related U.S. Application Data

(63) Continuation of application No. PCT/CN2024/088529, filed on Apr. 18, 2024.

(30) Foreign Application Priority Data

Sep. 8, 2023 (CN) .......................... 202311157016.9

(51) Int. Cl.
| | |
|---|---|
| H01L 23/00 | (2006.01) |
| C08K 3/04 | (2006.01) |
| C08K 3/36 | (2006.01) |
| C09D 163/00 | (2006.01) |

(52) U.S. Cl.
CPC ............ *H01L 24/96* (2013.01); *C09D 163/00* (2013.01); *C08K 3/04* (2013.01); *C08K 3/36* (2013.01); *C08K 2201/005* (2013.01); *H01L 2224/95001* (2013.01); *H01L 2924/3511* (2013.01)

(58) Field of Classification Search
CPC ........... H01L 24/96; H01L 2224/95001; H01L 2924/3511; C09D 163/00; C08K 3/04; C08K 3/36; C08K 2201/005

USPC .......................................................... 438/613
See application file for complete search history.

(56) References Cited

U.S. PATENT DOCUMENTS

2003/0153650 A1* 8/2003 Tada ...................... C08L 63/00
                                                       523/400

FOREIGN PATENT DOCUMENTS

| CN | 113462128 A | 10/2021 |
|---|---|---|
| CN | 114276653 A | 4/2022 |
| JP | 2011223014 A | 11/2011 |

OTHER PUBLICATIONS

Epoxy Resin and Epoxy Resin Composition (Year: 2006).*
English Machine Translation, JP 2011-223014 (Year: 2011).*

* cited by examiner

*Primary Examiner* — Caleen O Sullivan
(74) *Attorney, Agent, or Firm* — Nitin Kaushik

(57) ABSTRACT

Provided in the present invention is a wafer warpage regulation epoxy functional film. The wafer warpage regulation epoxy functional film includes the raw material components, in percentage by mass, 33% of an epoxy resin, 50%-52% of silica, 12%-14% of a curing agent, 1% of a curing accelerator, and 2% of a coloring agent; and the epoxy resin includes a bisphenol F-type epoxy resin and a phenolic epoxy resin. Besides, the above raw material components are stirred and mixed to obtain a slurry, the slurry is coated to a back of a wafer body, and after curing, the epoxy functional film which is formed by the phenolic epoxy resin has high shrinkage and large warpage, to drive the back of the wafer body to warp so as to drive a front of the wafer body to warp backwards.

4 Claims, 1 Drawing Sheet

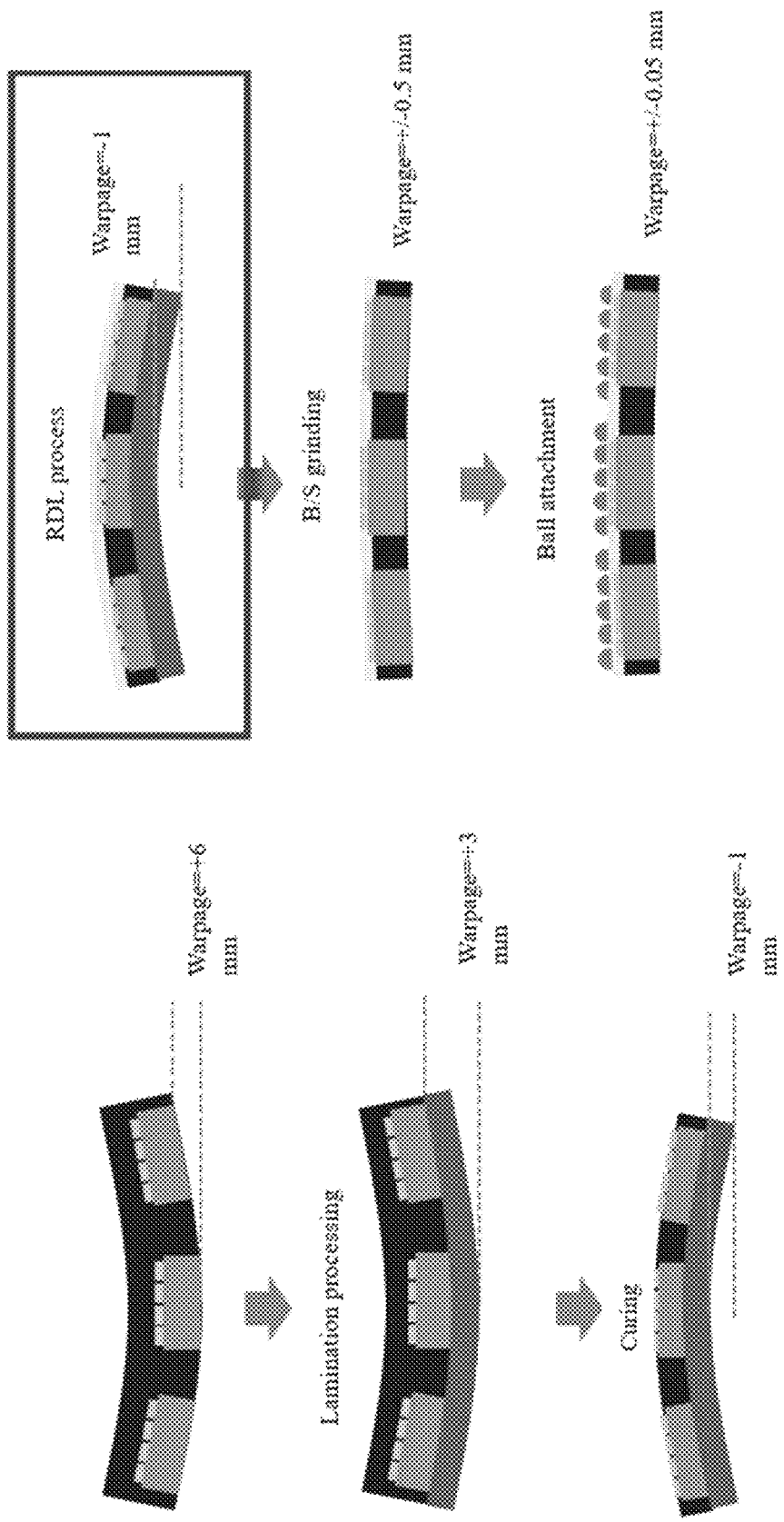

WAFER WARPAGE REGULATION EPOXY FUNCTIONAL FILM, AND PREPARATION METHOD AND APPLICATION THEREOF

CROSS-REFERENCE TO RELATED APPLICATIONS

The application claims priority to Chinese patent application No. 202311157016.9, filed on Sep. 8, 2023, the entire contents of which are incorporated herein by reference.

TECHNICAL FIELD

The present invention belongs to the technical field of packaging of an electronic device, and particularly relates to a wafer warpage regulation epoxy functional film and a preparation method and application thereof.

BACKGROUND

Wafer-level chip size packaging is a process of completing packaging integration on a substrate, which has the advantage of significantly reducing the area of a packaging structure. Traditional packaging is completed after a wafer is divided into individual chips, while the wafer-level chip size packaging is a process of chip packaging and testing on the wafer. Compared to a traditional packaging process, wafer-level packaging is greatly cost-saving.

However, in a wafer-level chip size packaging process, warpage occurs due to different thermal expansion coefficients of various materials in components, and when the warpage exceeds a certain amplitude, poor soldering quality in a surface mount technology (SMT) for electronic circuits can be caused, which in turn affects a subsequent redistribution layer (RDL) process.

Therefore, how to provide a wafer warpage regulation epoxy functional film to control warpage of wafers is an urgent technical problem that those skilled in the art need to solve.

SUMMARY

The objective of the present invention is to provide a wafer warpage regulation epoxy functional film and a preparation method and application thereof, in order to solve at least one of the above-mentioned technical problems.

In order to realize the objective, in the first aspect, the present invention provides a wafer warpage regulation epoxy functional film. The wafer warpage regulation epoxy functional film includes raw material components, in percentage by mass, 33% of an epoxy resin, 50%-52% of silica, 12%-14% of a curing agent, 1% of a curing accelerator, and 2% of a coloring agent; and the epoxy resin includes a bisphenol F-type epoxy resin and a phenolic epoxy resin.

In the first aspect, an epoxy equivalent of the bisphenol F-type epoxy resin is 160-180 g/eq; and an epoxy equivalent of the phenolic epoxy resin is 180-190 g/eq.

In the first aspect, the curing agent includes a naphthol curing agent.

In the first aspect, a hydroxyl equivalent of the naphthol curing agent is 100-120 g/eq.

In the first aspect, the silica includes fused silica; and the particle size D50 of the fused silica is 0.3 μm.

In the first aspect, the curing accelerator includes triphenylphosphine.

In the first aspect, the coloring agent includes carbon black, with an average particle size of 31 nm.

In the second aspect, the present invention provides a preparation method of the wafer warpage regulation epoxy functional film. The preparation method includes: mixing and stirring various raw material components in the wafer warpage regulation epoxy functional film to obtain slurry; and coating the slurry to obtain the wafer warpage regulation epoxy functional film.

In the third aspect, the present invention provides a method for regulating wafer warpage, including: in a process of preparing a wafer, attaching a layer of any wafer warpage regulation epoxy functional film to a back of a wafer body, after the wafer warpage regulation epoxy functional film is cured, driving the back of the wafer body to warp by means of the wafer warpage regulation epoxy functional film, so as to drive a front of the wafer body to wrap backwards, where curing conditions include: curing temperature of 220° C., and curing time of 4 h.

In the fourth aspect, the present invention provides a preparation method of a wafer, including: obtaining a wafer body; attaching a layer of any wafer warpage regulation epoxy functional film to a back of a wafer body, to enter a redistribution layer process; and after the redistribution layer process is completed, grinding off the wafer warpage regulation epoxy functional film to obtain the wafer.

Beneficial Effects

Provided in the present invention is a wafer warpage regulation epoxy functional film. The wafer warpage regulation epoxy functional film includes raw material components, in percentage by mass, 33% of an epoxy resin, 50%-52% of silica, 12%-14% of a curing agent, 1% of a curing accelerator, and 2% of a coloring agent; and the epoxy resin includes a bisphenol F-type epoxy resin and a phenolic epoxy resin. The thermal shrinkage of the phenolic epoxy resin is relatively high. The film formed by adding different proportions of the phenolic epoxy resin has different thermal expansion coefficients. During a high-temperature curing process, the formed film has higher thermal expansion coefficients and also has higher shrinkage after curing, resulting in larger warpage. In the present invention, a proportion of the bisphenol F-type epoxy resin to the phenolic epoxy resin is adjusted to change the warpage of the epoxy functional film. Besides, the above raw material components are stirred and mixed to obtain a slurry, the slurry is coated to a back of a wafer, and after curing, the epoxy functional film which is formed by the phenolic epoxy resin has high shrinkage and large warpage, to drive the back of the wafer to warp so as to drive a front of the wafer to warp backwards.

BRIEF DESCRIPTION OF THE DRAWINGS

To illustrate the technical solutions in the embodiments of the present invention or in the prior art more clearly, the following briefly introduces the accompanying drawings to be used for describing the embodiments. Obviously, the accompanying drawings in the following description only show some embodiments of the present invention, and those skilled in the art may still derive other accompanying drawings from these accompanying drawings without creative efforts.

FIG. 1 is a flowchart of a preparation method of a wafer provided in the embodiment of the present application.

DETAILED DESCRIPTION OF THE EMBODIMENTS

The disclosure will be described in detail in combination with specific implementations and embodiments, from which the advantages and various effects of the present invention will be presented more clearly. Those skilled in the art should understand that these specific implementations and embodiments are used to illustrate the present invention, but not to limit the present invention.

Throughout the description, unless otherwise specified, the terms used herein should be understood as having meanings commonly used in the art. Therefore, unless otherwise defined, all technical and scientific terms used herein have the same meanings as those commonly understood by those skilled in the art to which the present invention belongs. If there is a conflict, the description takes precedence.

Unless otherwise specified, various raw materials, reagents, instruments, devices, etc. used in the present invention can be purchased from the market or can be prepared by existing methods.

Provided in the present application is a wafer warpage regulation epoxy functional film. The wafer warpage regulation epoxy functional film includes raw material components, in percentage by mass, 33% of an epoxy resin, 50%-52% of silica, 12%-14% of a curing agent, 1% of a curing accelerator, and 2% of a coloring agent; and the epoxy resin includes a bisphenol F-type epoxy resin and a phenolic epoxy resin.

In some possible embodiments, an epoxy equivalent of a bisphenol F-type epoxy resin is 160-180 g/eq; and an epoxy equivalent of the phenolic epoxy resin is 180-190 g/eq.

The thermal shrinkage of the phenolic epoxy resin is relatively high. The film formed by adding different proportions of the phenolic epoxy resin has different thermal expansion coefficients. During a high-temperature curing process, the formed film has higher thermal expansion coefficients and also has higher shrinkage after curing, resulting in larger warpage. In the present invention, the warpage of the epoxy functional film is changed by regulating the proportion of the bisphenol F-type epoxy resin to the phenolic epoxy resin. The bisphenol F-type epoxy resin and the phenolic epoxy resin can be purchased from market. For example, the bisphenol F-type epoxy resin is an NPEF-170 product of Jiadida New Materials Co., Ltd., and the phenolic epoxy resin is an SQCN701-40 product of Jinan Shengquan Group Co., Ltd.

In some possible embodiments, the curing agent includes a naphthol curing agent.

In some possible embodiments, a hydroxyl equivalent of the naphthol curing agent is 100-120 g/eq.

By utilizing an addition reaction between hydroxyl groups in the naphthol curing agent and epoxy groups in the phenolic epoxy resin, a portion of segments of a cured product are formed. Through gradual polymerization reactions, linear molecules are cross-linked to form bulk structural molecules, thereby improving the strength of the epoxy functional film. The naphthol curing agent can be purchased from market, such as the SN-395 product from CHEM-MAT TECHNOLOGIES.

In some possible embodiments, the silica includes fused silica.

In some possible embodiments, the particle size D50 of the fused silica is 0.3 μm.

Silica particles can be uniformly dispersed in the phenolic epoxy resin, which can generate strong interfacial interactions with a resin matrix and enhance interfacial bonding. When the matrix is deformed due to external force, the silica particles are not liable to detach from the matrix. Borne tensile stress can be well transferred within the matrix, and plastic deformation and crack propagation of the matrix can be effectively prevented, thereby enhancing toughness.

In some possible embodiments, the curing accelerator includes triphenylphosphine.

The curing accelerator includes the triphenylphosphine, and the triphenylphosphine can be used to initiate the addition reaction between the naphthol curing agent and the phenolic epoxy resin, increasing a reaction rate.

In some possible embodiments, the coloring agent includes carbon black, with an average particle size of 31 nm.

The coloring agent includes carbon black, with an average particle size of 31 nm, thereby realizing dyeing of the epoxy functional film.

Based on a general inventive concept, the present application also provides a preparation method of the wafer warpage regulation epoxy functional film. The preparation method includes: mixing and stirring various raw material components in the epoxy functional film to obtain slurry; and coating the slurry to obtain the wafer warpage regulation epoxy functional film.

Based on a general inventive concept, the present application also provides a method for regulating wafer warpage. The method includes: in a process of preparing a wafer, attaching a layer of any wafer warpage regulation epoxy functional film to a back of a wafer body, after the wafer warpage regulation epoxy functional film is cured, driving the back of the wafer body to warp by means of the wafer warpage regulation epoxy functional film, so as to drive a front of the wafer body to wrap backwards, where curing conditions include: curing temperature of 220° C., and curing time of 4 h.

Based on a general inventive concept, the present application also provides a preparation method of a wafer. The method includes: obtaining a wafer body; attaching a layer of any wafer warpage regulation epoxy functional film to a back of a wafer body, to enter a redistribution layer process; and after the redistribution layer process is completed, grinding off the wafer warpage regulation epoxy functional film to obtain the wafer.

The present application will be further illustrated below in conjunction with specific embodiments. It shall be understood that, these embodiments are used for illustrative purposes only, not limitative to the scope of the present application. In the embodiments below, measurements in the experimental methods with specific conditions unspecified are typically performed in accordance with national standards. In case of absence of the respective national standards, measurements are performed in accordance with general international standards and general conditions or in accordance with conditions suggested by manufacturers.

The raw material components of the wafer warpage regulation epoxy functional film in embodiments 1-4 and Comparative embodiments 1-2 are shown in Table 1 in percentage by mass:

TABLE 1

Raw material components in percentage by mass

| Raw material component | Embodiment 1 | Embodiment 2 | Embodiment 3 | Embodiment 4 | Comparative embodiment 1 | Comparative embodiment 2 |
|---|---|---|---|---|---|---|
| Bisphenol F-type epoxy resin | 13 | 15 | 19 | 21 | 15 | 19 |
| Phenolic epoxy resin | 20 | 18 | 14 | 12 | — | — |
| Bisphenol A-type epoxy resin | — | — | — | — | 18 | 14 |
| Naphthol curing agent | 15 | 14 | 12 | 11 | 14 | 12 |
| Phosphine curing accelerator | 1 | 1 | 1 | 1 | 1 | 1 |
| Silica | 49 | 50 | 52 | 53 | 50 | 52 |
| Carbon black | 2 | 2 | 2 | 2 | 2 | 2 |

The raw material components according to Embodiments 1-4 and Comparable embodiments 1-2 are mixed and stirred to prepare slurry, the slurry is coated to form the film for testing, and a specific test process is as follows:

1. Warpage test: After slurry is made through a formula, the slurry is coated to form a film with the thickness of 40 μm, the film is cut into sample pieces with a size of 20 mm×20 mm. A light release film is torn off, and the functional film is subjected to heat transfer to be attached to a round glass sheet with a thickness of 100 μm and a diameter of 10 cm under a pressure of 90° C./2 kg. A heavy release film is torn off, the functional film at an edge of the glass sheet is cut clean, and then the glass sheet is placed in an oven to be cured at 220° C. for 4 h. After curing, the cured glass sheet is naturally cooled to room temperature. After the cooled glass sheet is kept at room temperature for 24 hours, a warpage size of the glass sheet is measured with a steel ruler.
2. Tensile strength at break (film strength): After the slurry is made through the formula, the slurry is coated to form a film with the thickness of 40 μm, the film is cut into sample pieces with dimensions of 10 mm×55 mm, and the sample pieces are tested at 24° C. using a universal tensile machine at a test speed of 300 mm/min. The maximum tensile strength at break is recorded.
3. Adhesion test of the silicon wafer at 220° C.: A 2 mm×2 mm film piece with a thickness of 40 μm is transferred onto the silicon wafer, and then the silicon wafer is cured at 150° C. for 1 hour, and heated to 220° C. using the universal tensile machine to test the shear bonding strength.
4. Testing of peeling force of matrix: After the slurry is made through the formula, the slurry is coated to form a film with the thickness of 40 μm, the film is cut into sample pieces with dimensions of 150 mm×25 mm, and the film is peeled in off perpendicular to the matrix at 24° C. at an angle of 90°, and tested using the universal tensile machine at a test speed of 300 mm/min. The maximum stable peeling force is recorded.
5. Thermal expansion coefficient: 35-40 films with the thickness of 100 mm×150 mm and a thickness of 40 μm are taken, subjected to heat paste and stacked to form a thick sheet under a pressure of 90° C./2 kg, then the thick sheet is cut into 10 mm×—60 mm sample pieces, and the sample pieces are placed in a mold. The sample pieces are heated at 180° C. for curing for 1 hour, the cured sample pieces are taken out from the mold, the 10 mm×10 mm film pieces with the thickness of 1.2 mm are cut to form sample pieces, and the sample pieces are used as thermal expansion coefficient measurement samples. The samples are placed on TMA and thermal analysis is performed when heat quantity is increased from room temperature to 250° C. After the measurement is completed, the thermal expansion coefficient value in the range of 175-220° C. is read.

The test results are shown in Table 2:

TABLE 2

Test Results

| Test items | Embodiment 1 | Embodiment 2 | Embodiment 3 | Embodiment 4 | Comparative embodiment 1 | Comparative embodiment 2 |
|---|---|---|---|---|---|---|
| Warpage test (mm) | 11.4 | 10.9 | 9.8 | 9.1 | 6.9 | 6.4 |
| Tensile strength at break (gf/10 mm) | 271 | 217 | 145 | 76 | 197 | 116 |

TABLE 2-continued

Test Results

| Test items | Embodiment 1 | Embodiment 2 | Embodiment 3 | Embodiment 4 | Comparative embodiment 1 | Comparative embodiment 2 |
|---|---|---|---|---|---|---|
| Test of adhesion of silicon wafer at 220° C. (MPa) | 4.7 | 7.1 | 9.4 | 10.7 | 6.7 | 7.3 |
| Test of peeling force of matrix (gf/25 mm) | 17 | 21 | 32 | 37 | 24 | 29 |
| Thermal expansion coefficient (ppm/° C.) | 137 | 129 | 111 | 101 | 87 | 82 |

It should be noted that the epoxy functional film provided by the present invention will use an automatic film sticking machine during application, and its normal work ability requirements are: a. tensile strength at break is 140-220 gf/10 mm; b. peeling force range for the matrix is 20-35 gf/25 mm; and c. adhesive strength requirements for 5 silicon wafers at 220° C. are not less than 5 MPa.

As shown in the Table and FIG. 1, the epoxy functional film prepared using Embodiments 2 and 3 of the present application can be applied to the automatic film sticking machine with relatively high warpage. A mold with a thickness of 600 μm and a warpage of +6 mm is selected, a layer of epoxy functional film prepared in Embodiment 3 or 4, with a coating thickness of 40 μm and a warpage of +3 mm, is coated. After coating is completed, curing is performed and the epoxy functional film drives the mold to warp backwards, with a warpage of −1 mm. The subsequent RDL process is performed. After the RDL process is completed, the coated epoxy functional film is ground to control the warpage of the mold at around 0.5 mm for the next process.

Moreover, the terminology "comprising", "including" or any other alterations are intended to cover non-exclusive inclusion, so as to make a process, method, article or apparatus including a series of elements further includes elements that are not listed explicitly other than said series of elements, or includes elements inherent to such process, method, article or apparatus.

Although the preferred embodiments of the present invention have been described, those skilled in the art benefiting from the underlying inventive concept can make additional modifications and variations to these embodiments. Therefore the appended claims are intended to be construed as encompassing the embodiments and all the modifications and variations falling in the scope of the present invention.

Apparently, various modifications and variations to the present invention can be made by those skilled in this art without departing from the spirit and scope of the present invention. Thereby, the present invention intends to encompass all such modifications and variations within the scope of the claims of the present invention and its equivalents.

What is claimed is:

1. A wafer warpage regulation epoxy functional film, wherein, in percentage by mass, the wafer warpage regulation epoxy functional film consists of 33% of an epoxy resin, 50%-52% of silica, 12%-14% of a curing agent, 1% of a curing accelerator, and 2% of a coloring agent; the epoxy resin comprises a bisphenol F-type epoxy resin and a phenolic epoxy resin; the curing agent comprises a naphthol curing agent; a hydroxyl equivalent of the naphthol curing agent is 100-120 g/eq; the curing accelerator comprises triphenylphosphine; an epoxy equivalent of the bisphenol F-type epoxy resin is 160-180 g/eq; an epoxy equivalent of the phenolic epoxy resin is 180-190 g/eq; the silica comprises fused silica; the particle size D50 of the fused silica is 0.3 μm; and the coloring agent comprises carbon black, with an average particle size of 31 nm.

2. A preparation method of a wafer warpage regulation epoxy functional film, comprising:
   mixing and stirring various raw material components in the wafer warpage regulation epoxy functional film of claim 1 to obtain slurry; and
   coating the slurry to obtain the wafer warpage regulation epoxy functional film.

3. A method for regulating wafer warpage, comprising:
   in a process of preparing a wafer, attaching a layer of wafer warpage regulation epoxy functional film of claim 1 to a back of a wafer body, after the wafer warpage regulation epoxy functional film is cured, driving the back of the wafer body to warp by means of the wafer warpage regulation epoxy functional film, so as to drive a front of the wafer body to wrap backwards, wherein curing conditions comprise: curing temperature of 220° C., and curing time of 4 h.

4. A preparation method of a wafer, comprising:
   obtaining a wafer body;
   attaching a layer of a wafer warpage regulation epoxy functional film of claim 1 to a back of a wafer body, to enter a redistribution layer process;
   after the redistribution layer process is completed, grinding off the wafer warpage regulation epoxy functional film to obtain the wafer.

\* \* \* \* \*